(12) United States Patent
Vaucher

(10) Patent No.: US 6,859,052 B1
(45) Date of Patent: Feb. 22, 2005

(54) ELECTRIC TEST OF THE INTERCONNECTION OF ELECTRIC CONDUCTORS ON A SUBSTRATE

(76) Inventor: Christophe Vaucher, 769 Boulevard de l'Escourche, 83150 Bandol (FR)

( * ) Notice: Subject to any disclaimer, the term of this patent is extended or adjusted under 35 U.S.C. 154(b) by 0 days.

(21) Appl. No.: 10/130,545
(22) PCT Filed: Nov. 23, 2000
(86) PCT No.: PCT/FR00/03262
§ 371 (c)(1), (2), (4) Date: May 15, 2002
(87) PCT Pub. No.: WO01/38892
PCT Pub. Date: May 31, 2001

(30) Foreign Application Priority Data
Nov. 26, 1999 (FR) .............................. 99 14876

(51) Int. Cl.[7] ...................... G01R 31/305; G01R 31/02
(52) U.S. Cl. ...................................... 324/751; 324/73.1
(58) Field of Search ................................ 324/751–753, 324/73.1, 158.1, 96; 356/364, 369, 400; 250/310–311

(56) References Cited

U.S. PATENT DOCUMENTS

| | | | |
|---|---|---|---|
| 4,573,008 A | 2/1986 | Lischke | 324/158 |
| 4,837,506 A | 6/1989 | Patterson | 324/258 |
| 4,967,152 A | 10/1990 | Patterson | 324/258 |
| 5,030,908 A * | 7/1991 | Miyoshi et al. | 324/752 |
| 5,122,737 A * | 6/1992 | Clauberg | 324/767 |
| 5,141,602 A * | 8/1992 | Chen et al. | 205/103 |
| 5,150,043 A * | 9/1992 | Flesner | 324/752 |
| 6,072,179 A * | 6/2000 | Paniccia et al. | 250/341.4 |
| 6,369,590 B1 * | 4/2002 | Cugini et al. | 324/752 |
| 6,369,591 B1 * | 4/2002 | Cugini et al. | 324/752 |
| 6,512,385 B1 * | 1/2003 | Pfaff et al. | 324/753 |
| 6,653,851 B2 * | 11/2003 | Cugini et al. | 324/752 |

* cited by examiner

*Primary Examiner*—David Zarneke
*Assistant Examiner*—Jermele Hollington
(74) *Attorney, Agent, or Firm*—Patterson, Thuente, Skaar & Christensen, P.A.

(57) ABSTRACT

To measure the resistance from one end of a conductor (4) to the other or between conductors, for the purpose of testing them, by establishing an electric current in the conductor, without any mechanical contact therewith, this method includes providing opposite and proximate to the conductor (4) a plate (2) that has a plurality of conductive zones (8, 10) capable of being individually taken to any adjustable electric potentials, applying a beam of particles (7) to a first point (C) of the conductor (4) to extract electrons from it, and injecting electrons at a second point (B) of the conductor (4).

23 Claims, 3 Drawing Sheets

ELECTRIC TEST OF THE INTERCONNECTION OF ELECTRIC CONDUCTORS ON A SUBSTRATE

BACKGROUND OF THE INVENTION

1. Field of the Invention

The present invention relates to a method for electrically testing conductors.

It particularly, but not exclusively, applies to the electric test of substrates, such as semi-conductor chips or integrated circuits, and printed circuits.

2. Description of the Related Art

Current test machines measure the continuity of tracks and their insulation. For that purpose, they use tools with which it is possible to take or extract electrons from conductors. Among these tools, there is what is called "nail boards" that are specific to each type of circuit. It transpires that with the reduction in the dimensions of electronic components and the considerable increase in the density of printed circuit tracks, these tools are becoming more and more complex to produce, and therefore very expensive and less reliable. In addition, their manufacturing lead-time (from one to several days) is increasing, which is contrary to the greater manufacturing flexibility required by new generations of printed circuits (the shortening of production cycles imposes a heavy restriction on the manufacturing of these nail boards).

To take or extract electrons from conductors, there are also devices that use a high-energy source of coherent light, which, by photoelectric effect, leads to the rise in the voltage of these conductors. These tools are for example described in U.S. Pat. Nos. 4,837,506 and 4,967,152.

The photoelectric effect consists in the emission of electrons by a metal under the action of light radiation. More generally speaking, the photoelectric effect covers several phenomena of interaction between light and matter, in which photons transfer their energy to electrons. Thus, there is the external photoelectric effect, also called photoemission, and the internal photoelectric effect that comprises photoconductivity, the photovoltaic effect and photo-ionization.

It results in the absorption of certain photons by the metal: if the energy of a photon is higher than the energy linking an electron to one atom of the metal, that electron may then leave its atomic orbital, acquiring kinetic energy and creating an electric current.

In the photoelectric effect, the electrons are therefore ejected from a metal (or conductor) by the collision with incident photons. In fact, the electrons are kept inside the metal by a barrier of potential, called "Work Function" (WF). To enable an electron to be ejected, the energy of the photons must be higher than WF. For example, for copper, WF is approximately 4.3 eV (electron-Volts), and, as a result, the wavelength of the source of coherent light must be shorter than 1.24/4.3 =290 nm. Shorter wavelengths enable electrons to be released with non-zero kinetic energy.

The photoelectric effect does not depend on the intensity of the source of light. It can therefore be observed even for very low power used, which means that operation that does not damage the conductor can be considered. It does not occur at insulant level, even though ionization can occur under the action of highly energetic photons.

The ejected electrons can be collected by a positively biased electrode, and the current thus created can be measured. That requires a partial vacuum, so that most of the electrons can reach the electrode, without hitting too many air molecules.

The power of the ultraviolet source, typically a laser, depends on the current and the charging time of the conductors. For example, if a conductor has a capacitance of 100 pF, and if this conductor is to be positively charged to 100 V in one ms, then the corresponding current will be:

$$I=Q \ V/t=100 \times 10^{-10}/0.001=10^{-5} \ A$$

The necessary power of the laser must be:

$$P=I \times Eph/Efficiency=10^{-5} \times 4.8/0.05 \approx mW$$

assuming that 5% of the photons emitted effectively produce the photoelectric effect.

Now if the interconnection of substrates is to be checked, such as semi-conductor chips or printed circuits, all the conductors must be checked for any full or partial cut between two pads that are supposed to house components, with regard to the theoretical model, and each conductor must be checked to make sure that there is no dead or partial short circuit with one or several other conductors.

In previous practices (U.S. Pat. No. 4,967,152, for example), cuts are detected according to the following principle:

A fine metal grid is arranged vertically to the substrate to be tested. It is taken to a positive potential in relation to the substrate to be checked, for example in the order of 100 V.

The ultraviolet source passing almost transparently through the metal grid, is directed onto the end of a conductor and leads to the release of electrons from the corresponding conductor. These electrons are then captured by the grid, that attracts them. A current is then collected. This operation is continued until the current collected reaches a determined threshold, which means that the conductor is then electrically charged to the value of approximately 100 V. The charging time depends, among others, on the conductor's capacitance, and on the power of the laser.

A conductor previously charged in this way does not lead to the release of other electrons in the same conditions of excitation, and regardless of the place at which its excitation is done. On the other hand, if it is cut somewhere, and it the same excitation is done on the other side of the cut, then the part that has not previously been charged will emit of electrons in the form of a capacitance charge.

Then, the method is repeated to test the continuity of the other conductors.

However, in the partial vacuum used, the conductors do not discharge. Thus, at the end of the test described above, the substrate will be completely charged. Insofar as the laser source is not affected by the charge of the neighbouring conductors, that does not unduly disturb the photoelectric effect, but the electrons ejected have a tendency to go to join neighbouring conductors previously charged to 100 V, and no longer solely to the grid, which significantly alters the current collected by the grid, and distorts the conclusions drawn from the value of the currents measured, which can lead to an incorrect diagnostic.

One possible alternative is to gradually increase the voltage of the collection grid throughout the test, but, nonetheless, a loss of electrons is observed, the latter being collected by neighbouring conductors of potential (the last ones tested). Furthermore, as the number of conductors may be in the order of several thousands, the idea of increasing the potential by progressive jumps along the conductors is soon limited.

Moreover, the measurement of the resistance, an important criterion when validating the test principle of a technology, is not really possible here: even weak traces of conductors defectively linking the two portions of a single conductor will have a time constant RC that is sufficiently short not to be detected, while the corresponding resistance (high in this case) of the link should be analyzed like a real defect.

Short-circuits are detected in previous practices by first charging a given conductor, and by looking for other conductors having a similar potential on the substrate, highlighting a physical connection with the reference conductor, and thus the existence of a short circuit. Here, once again, there is the problem of conductors discharging.

The use of the photoelectric effect to measure short circuits and cuts on substrates having a large amount of conductors is therefore a problem.

In more recent previous practices, a single source of light is typically used to carry out circuit tests, which considerably reduces productivity and therefore increases the cost of them.

Contactless test systems have recently been produced. However, these systems cannot measure low interconnection resistances of certain substrates, such as printed circuits that are part of the new generations of boxes for semiconductor chips, while the increasingly higher frequencies of this type of application require interconnection resistances lower than a threshold (typically 10 ohms or less). These resistances cannot be measured by the contactless test technologies of previous practices (electron beam test as described in the document U.S. Pat. No. 4,573,008 by using an electric conduction path, by creating a plasma or by using the simple photoelectric effect).

In fact, none of the technologies described above enables a current to be circulated from one end to the other of a conductor, without mechanically accessing (by touching it) one and/or the other of its ends, and none of them enables the resistance of these conductors to be measured accurately.

OBJECTS AND SUMMARY OF THE INVENTION

The present invention aims to solve these problems. It also aims to charge conductors (ejection of electrons), and to enable these conductors to recover electrons (injection or absorption), and as a result, to discharge (negative evolution of their potential by absorption of electrons), so as to be able to use these two modes to individually check the potential of each conductor to be tested, and to check the conformity of their interconnection by the introduction of algorithms.

These objectives are achieved by providing a method for establishing an electric current in a conductor, including:
providing, opposite and proximate to the conductor, a plate that has a plurality of conductive zones capable of being taken individually to any adjustable electric potentials,
applying a beam of particles to a first point of the conductor to extract electrons from it, and
at the same time, injecting electrons at a second point of the conductor, producing a circulation of electric current in the conductor between the first point and the second point.

According to a first embodiment of the present invention, said beam of particles is a beam of light emitted by an ultraviolet light source, having sufficient energy to extract electrons from the conductor.

In this case, the method according to the present invention may include steps of:
previously taking the conductor to a first potential,
taking a first conductive zone to the plate, located near the first point of the conductor, to a second predefined potential ($V^+$) that is higher than the first potential, and
taking conductive zones that are near the first zone to a third potential that is lower than the second potential, so that the electrons extracted from the conductor by the beam of light are channeled towards the first conductive zone by the neighboring conductive zones.

According to one special feature of the present invention, the injection of electrons at the second point of the conductor includes taking a third conductive zone of the plate, located near said second point, and zones that are near them, to a potential that is close to the first potential, then applying a beam of ultraviolet light to the third conductive zone.

For that purpose, the plate may comprise a plurality of conductive zones, each of these zones having a thickness such that by applying a beam of ultraviolet light to them on one side of the plate, they emit electrons towards a conductor of the substrate located proximate to the other side of the plate.

According to a second embodiment of the present invention, the injection of electrons at the second point of the conductor is done using a set of a plurality of microtips, arranged opposite said second point on the plate, and comprising a conductive grid that is taken to a potential higher than the potential applied to the microtips, to emit electrons.

In this case, the plate may advantageously comprise a plurality of sets of microtips arranged in a matrix network on the plate, each set being individually controllable to emit electrons towards a conductor of the substrate.

According to a third embodiment of the present invention, the injection of electrons at the second point of the conductor is done using a network of conductive pads arranged in pixels in contact with an anisotropic conduction elastomer sheet in a perpendicular direction to said surface, said elastomer sheet being applied against the conductor, each conductive pad being capable of being individually taken to any adjustable potential.

The present invention also relates to an electric test method of conductors arranged on an insulating substrate, this method comprising an initial step of arranging, opposite at least one side of a substrate, a plate that has, at any region near a conductor of the substrate, conductive zones capable of being individually taken to any adjustable electric potentials, this method comprising a continuity test step of the conductors of the substrate including, for each conductor of the substrate, establishing a current in the conductor in compliance with the method defined above.

In its principle, this method includes controlling individually the potential of the conductors of the substrate to be tested, by ejection / injection of electrons, and measuring the corresponding flows of current.

This test method may, in addition, include determining the resistance of the conductor between the first and the second point of the conductor, and comparing the resistance thus determined with a predefined threshold, a defect being detected if the resistance is above said threshold.

This test method comprises advantageously an insulation test step of the conductors of the substrate, including;
taking all the conductors of the substrate to a predefined potential, and
for each conductor of the substrate, establishing a flow of electrons from one point of the conductor towards a first conductive zone of the plate, located near the point of the conductor, to take the conductor to a first predetermined potential, this flow being established by applying the first potential to the first conductive zone, and a second predefined potential lower than the first potential to conductive zones of the plate, near the first zone, and by applying a beam of light to that point of the conductor; and measuring the charging current of the conductor that must tend towards zero at the end of a predetermined time if the conductor is insulated.

According to one special feature of the present invention, if an insulation defect is detected on a conductor during the insulation test step, it comprises a secondary insulation test step of measuring the resistance between the defective conductor and all the other conductors of the substrate.

The present invention also relates to an electric test device of conductors arranged on an insulating substrate. This device comprises:

at least one source of particles combined with means of control, to emit a beam of particles towards any determined point of a conductor of the insulating substrate, so as to extract electrons from said conductor and therefore increase its electric potential, at least one plate, arranged opposite one respective side of the insulating substrate, and comprising conductive zones at any region near the vertical of a conductor of the substrate 1 to be tested, means for injecting electrons at any determined point of a conductor on the insulating substrate, and a control and measuring station to individually take the conductive zones to any adjustable electric potentials and to measure currents and voltages between any two previously selected conductive zones.

Advantageously, the source of particles is a source of ultraviolet light.

According to a first embodiment, this device comprises a plurality of laser micro-sources arranged over the surface of the plate.

Advantageously, each source of ultraviolet light is arranged at a distance from the plate and emits a beam the angle of which is adjustable around a 90° angle in relation to the plane of the plate.

According to a second embodiment, this device comprises a matrix network of sets of microtips arranged on the plate and individually controlled to emit electrons towards any one of the conductors of the substrate.

According to a third embodiment, this device comprises a network of conductive pads arranged in pixels in contact with an anisotropic conduction elastomer sheet in a perpendicular direction to said surface, said elastomer sheet being applied against the conductor, each conductive pad being capable of being individually taken to any adjustable potential.

According to one special feature of the present invention, the means for injecting electrons comprise a plurality of sources of electrons arranged according to a matrix network and individually controllable by line /column addressing.

The control and measuring station preferably comprises addressing means to select the conductive zones of the plates, to take to a determined potential, and from which the current or the voltage is measured.

According to one special feature of the present invention, this device comprises a partial vacuum chamber in which the insulating substrate and each plate are

BRIEF DESCRIPTION OF THE DRAWINGS

These and other objects, features and advantages of the present invention shall be presented in greater detail in the following description of preferred embodiments of the present invention, given in relation with, but not limited to, the following figures:

FIGS. 1 to 3 show a substrate 1 that has conductors 4 on one side, for which the electrical access required according to the present invention is done at contact pads 5. The substrate may also comprise on its other side conductors 4' and contact pads 5', the conductors 4 and 4' of the two sides possibly being linked by metal holes

DESCRIPTION OF THE PREFERRED EMBODIMENTS

Figure 1:
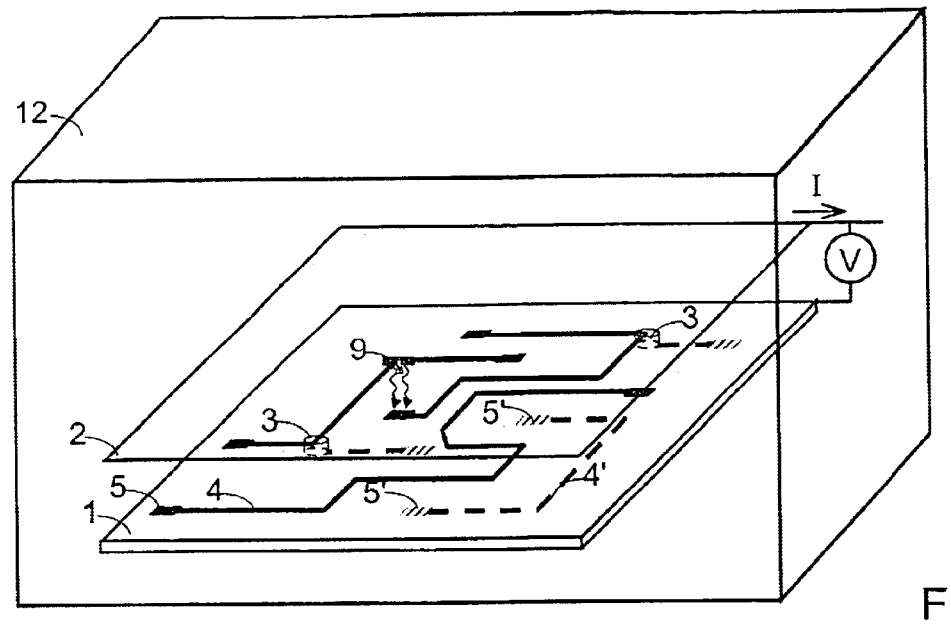
FIG. 1 represents a substrate bearing conductive tracks, inserted into a test device according to a first preferred embodiment of the present invention.

The present invention uses at least one source of ultraviolet light 7, 9. It relies on a specific device referred to below as "discharge and collection plate" 2, 2', using the photoelectric effect by stimulation by a source of ultraviolet rays of light 7 or 9.

The test device according to the present invention therefore comprises four main elements:

A. at least one discharge and collection plate 2, 2', constituted of a substrate comprising conductive zones 8, 10, totally or partially covering the substrate to be discharged, these conductive zones being capable of being individually taken to any electric potentials, positive, zero or negative and not necessarily identical, B. one or several sources of ultraviolet light 7 or 9, C. a partial vacuum chamber 12 (typically of 1 millitorr), housing the discharge and collection plates described above, and the substrate 1 and a frame supporting the assembly, D. a control and measuring station 11 used to count electrons (current measurement), to impose and to measure various voltages on the plates 2 and 2'. This measuring station is also used through specific addressing to program required states of the various conductors of the plates 2 and 2', and to measure the required signals.

The discharge and collection plate 2 is arranged parallel to the substrate 1 and opposite the side of the substrate to be tested where the conductors 4 and the contact pads 5 are located. In the event that conductors 4' are also present on the other side of the substrate 1, a second discharge and collection plate 2' can be arranged parallel to and opposite this side.

According to the present invention, a beam of ultraviolet light 9 ejects electrons 6 from one conductive zone 8 of the discharge and collection plate 2. For that purpose, the thickness of each conductive zone 8 is slightly higher than the skin thickness (50 to 100 Å) of the metal layer forming the conductive zone, such that on the one hand, the laser beam 9 does not reach the conductors 4 of the substrate 1, and on the other hand, a significant number of electrons extracted from the metal layer pass through it to reach the targeted conductor 4. The electrons thus extracted are then picked up by the conductor 4 near the emission vertical. This pick up zone may itself be limited by creating a circulation lane of electrons 13, around the impact area of the beam, by putting the targeted conductor 4 to a positive potential in relation to the conductive zone 8, and the other conductors 4 of the substrate and the neighbouring conductive zones 8, 10, of the plate 2, to a negative potential.

The discharge and collection plate 2 according to the present invention, is used, unlike in previous practices, both as a source and a local drain of electrons generated by photoelectric effect.

For that purpose, it comprises:

1. at any region near the vertical of a conductor 4 of the substrate 1 to be tested and on the side of it, conductive zones 8 that are individually programmable to a given potential by the control and measuring station 11, and capable of being bombarded by at least one of the sources of light for the purpose of emitting electrons, that are absorbed by the required conductor 4, through a circulation lane of electrons 13, provided that the potential of the targeted conductor 4 is higher than that of the emitting conductive zone 8, 2. at any region near the vertical of a conductor 4 of the substrate 1 to be tested, conductive zones 10, 10' the potential of which is independently adjustable to a given value, so as to be able to generate lanes to collect electrons 13 and to collect electrons emitted locally by the conductors 4 of the substrate 1 through these lanes, without any significant loss of electrons that might have gone to join other neighbouring conductors.

In other terms, the discharge and collection plate 2 is designed to perform the following three functions:

I. locally emit electrons towards a given conductor 4 of the substrate 1 to be tested, and to measure the corresponding current;

II. receive electrons from a given conductor 4 of the substrate 1 to be tested, and to measure the corresponding current;

III. produce circulation "lanes" of electrons 6 forcing electrons emitted by the plate 2 or by the substrate 1 to follow a given path, so as to control either their absorption by a given conductor 4 of the substrate 1, or their collection by a given point of the plate 2. These lanes are produced by programming to repellent potentials a chosen number of conductive zones 10, 10' the geometry of which will define the basis of the circulation lane 13 around the emission 8 or collection 10 point, this lane being established between the substrate and the plate, roughly perpendicular to the latter.

The sources of ultraviolet light 7, 9 may be integrated into the discharge and collection plate.

It should be noted that the direction of the beams coming from the sources of light 7, 9 is roughly perpendicular to the plane of the plate 2. However, in some embodiments, devices may be provided that enable these beams to be slightly sloped into a cone the axis of which is the perpendicular to the plate 2 at the emission point.

The measurement by conductor charging and discharging, according to the present invention, can be taken in the following way:

In a first step, all the conductors 4 present on the substrate 1 are discharged to a negative potential $V^-$. A simple means of achieving this is to program all the conductive zones 10 and 8 of the plates 2 and 2' to this potential $V^-$, and to bombard all the conductive zones 8 with one or more sources of ultraviolet light, such that the corresponding electrons of the metal zone 8 are ejected towards the conductors 4 of the substrate 1 until all the conductors 4 reach this potential $V^-$.

In a second step, when a continuity test of the equipotential lines of the substrate 1 to be tested is to be conducted, each conductor 4 undergoes the following procedure:

I. the conductor 4 is charged by bombardment by the source of ultraviolet light 7, some conductive zones 10c (hatched on FIG. 3) of the plate 2, on the periphery of the vertical of the conductive pad C at one end of the conductor 4, previously being programmed to the value $V^+$, thus creating a circulation lane of electrons 13. This results in the migration of electrons from the conductor 4 towards these conductive zones 10c and therefore in the start of the charging of the conductor 4 the potential of which rises;

II. at the same time, the conductor 4 is discharged near the pad B at another end of the conductor 4, by the injection of electrons by applying the source of ultraviolet light 9 to a conductive zone 8b of the plate 2, near the vertical of the pad B: as the conductor 4 is, at the same time, charged at another point, its potential must be higher than $V^+$, if it does not have any cuts.

The result is a flow of electrons from B towards C in the conductor 4, and therefore the circulation of a current I from C towards B in this conductor. This current is, in particular, a function f(R) of the resistance of the conductor between B and C. The continuity of the conductor is determined if this resistance is lower than a predefined threshold.

The current thus obtained is in the order of a few tens of pA (up to approximately one hundred pA) for an acceleration voltage of the electrons between 10 and 50 V.

Figure 3:
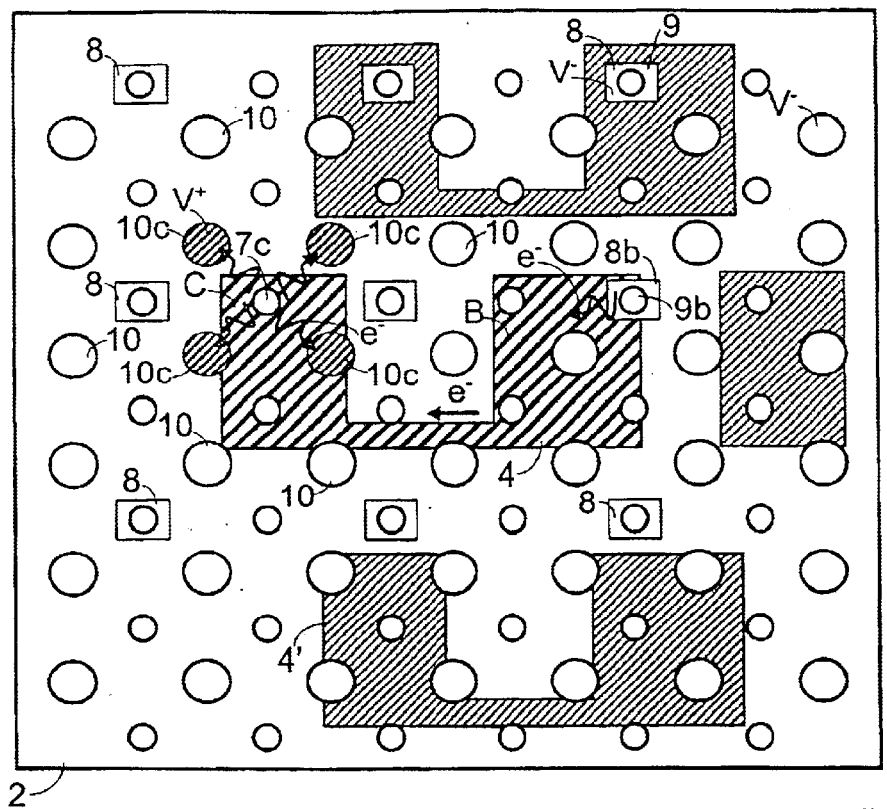
FIG. 3 shows a top view of the test device represented in FIG. 2.

Thus, on FIG. 3 which shows a top view of the discharge and collection plate 2, with conductors 4 and 4' showing through it, the bombardment of the conductive zone 8b by the micro-source 9b leads to the appearance of electrons at the point B of the conductor 4 charged positively by the bombardment of the conductor 4 at the point C by the source 7, which causes the circulation of a current I in the conductor 4 of the substrate 1, and therefore enables the conformity of the resistance to be measured from one point to another of the conductor 4 (continuity test). The four conductive zones 10c for this measurement are programmed to a positive potential $V^+$, enabling electrons to be collected towards the control and measuring station 11, the other neighbouring conductive zones 10 being, on the other hand, programmed to a negative potential $V^-$, along with the conductive zones 8, which enables the electrons to be pushed back towards the only exits possible that are the sources 10c.

In a third step, when an insulation test is to be conducted, each conductor 4 undergoes the following procedure:

I. the conductor 4 is charged to a potential $V^+$ by bombardment by the source of ultraviolet light 7, the conductive zones 10 of the plate 2, on the periphery of the vertical of the point C', having previously been taken to the potential A, while the others are taken to the potential $V^-$. The result is the migration of the electrons from the conductor 4 towards the conductive zones 10 through a circulation lane 13;

II. if the charging current does not approach zero at the end of a given time (at the end of a certain time, the potential of the conductor 4, if it is insulated, must approach V+), that means that there is a leak of electrons towards other conductors. This leak can be measured (residual current I), which enables the value of the leak resistance to be determined $R=(V^+-V^-)/I$.

The second and third steps are thus repeated for each conductor 4, 4' of the substrate 1 to be tested.

The distance between the substrate 1 and the plate 2 is not critical, as the acceleration energy of the electrons due to the potential difference (voltage drop) is independent of the distance between the two electrodes. On the other hand, it is partly defined by the embodiment chosen.

If an insulation defect is detected on a conductor during the insulation test step, a secondary insulation test step can be performed including measuring the resistance between the defective conductor and all the other conductors 4 of the substrate, so as to accurately locate between which conductors 4 the insulation defect is located.

According to a first embodiment of the present invention, shown in FIG. 3, the discharge and collection plate 2 is constituted by the juxtaposition of micro-sources of ultraviolet light 7, 9, and by conductive zones 10 the potential of which can be adjusted independently, some of these micro-sources 9b being covered with a fine layer of metal plate 8, the emission of the micro-source onto this plate causing the emission of electrons. This fine layer of metal plate has a thickness in the order of 150 Angstroms, while the electrons, as part of the photoelectric effect, penetrate into the metal to a depth of approximately 50 to 100 Angstroms.

These micro-sources can be organised in a matrix according to a fine pitch, for example in the order of 0.1 mm, i.e. several million laser micro-sources if the useful test surface areas are of approximately 300×200 mm.

It will be understood that the conductive zones 10 and the metal plate zones 8 can be identical.

Figure 2:
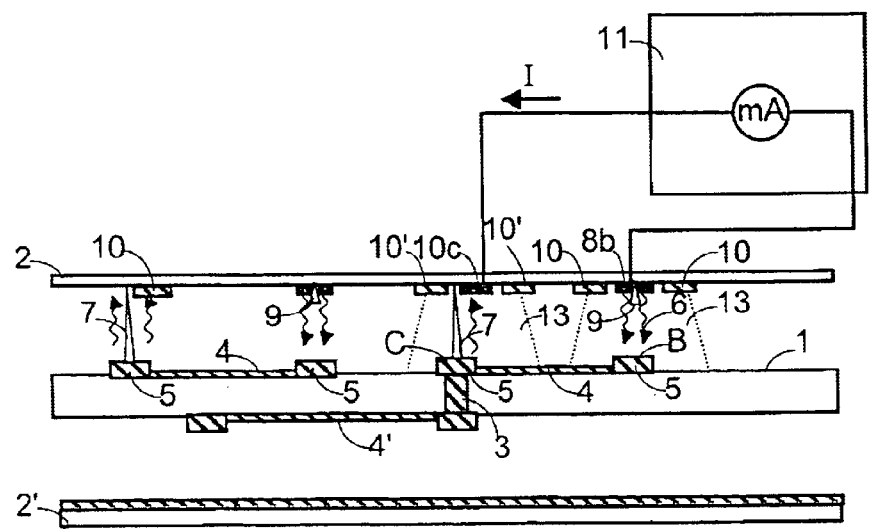
FIG. 2 shows a cross-section of a test device according to a second preferred embodiment of the present invention.

Two plates 2, 2' can be used, on either side of the substrate 1 (FIG. 2).

Figure 4:
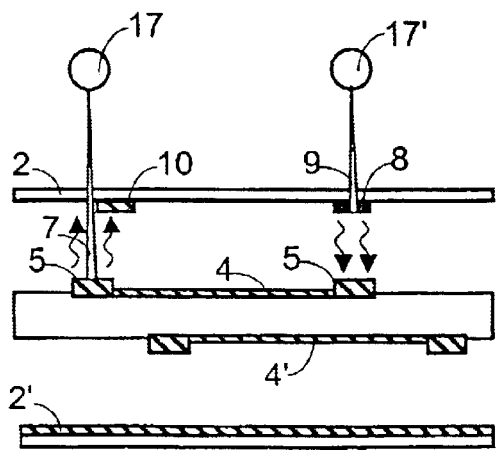
FIG. 4 shows a cross-section of a test device according to a third preferred embodiment of the present invention.

The emissions by the sources of ultraviolet light can be done at an angle that is different by 90 degrees to the plate 2, the value of this angle being programmable. Thus the required number of sources can be reduced, or the test resolution increased. In fact, this number can be reduced to one or two sources 17 on one side or on each side of the substrate (FIG. 4), depending on the configuration of the conductive tracks 4, 4' to be tested. In this case, the sources of light are placed at a distance from the plate 2, so as to be able to light up the whole substrate through the plate 2, under an angle of incidence that is preferably below 20°.

The sources of ultraviolet light are for example of the laser type YAG UV using the $4^{th}$ harmonic component at 266 nm, emitting with a pulsed power in the order of 27 mW.

The plates 2, 2' are advantageously produced with a material that is transparent to ultraviolet radiation, such as silica for example.

It will be understood that the conductive pads 8, 10 of the discharge and collection plates can be identical and used both to collect and to emit electrons depending on the value of the potential applied thereto.

Alternatively, by means of a few arrangements, one or more sets of microtips can be used as sources of electrons enabling a beam of electrons to be emitted, instead of laser sources using the photoelectric effect.

Figure 5:
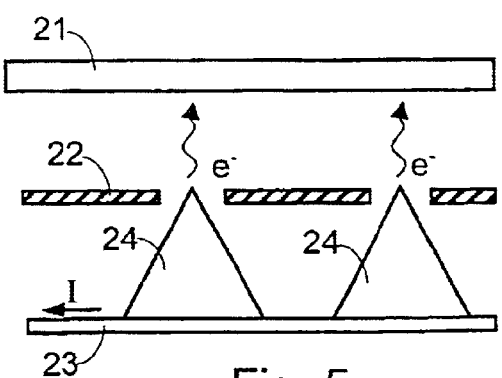
FIG. 5 shows a principle used in a test device according to a fourth preferred embodiment of the present invention.

On FIG. 5, these sets of microtips comprise, conventionally, fine silicon points 24 produced on a medium 23, and a metal grid 22 with holes near the tops of these microtips. If a voltage is applied to this grid that is higher than that of the points, that causes, by tunnelling effect or tip effect, the emission of electrons to which kinetic energy is supplied. As these electrons have crossed the potential barrier of the points, they are therefore free to move in the space. These electrons are then gathered by an anode 21, that is typically a conductor. In the present invention, this conductor corresponds to the metal tracks 4, 4' of the printed circuit to be tested, that can therefore be supplied with electrons without contact.

By comparison with the thermionic effect (incandescent lamp) this device can be referred to as a "cold cathode".

These sets have been designed to produce flat screens in which a fluorescent screen is bombarded by the electrons emitted by the microtips.

Unlike the microtips used in flat screens, the present invention suggests using these microtips in a normal polarisation mode.

Such sets can be manufactured in dimensions compatible with those of the circuits to be tested.

However, it should be noted that like in the case of matrices of laser micro-sources, a very dense spatial multiplexing system is required, i.e. using line/column multiplexing to individually control each micro-source or each set of microtips.

The dimension of the microtips is close to the micron and they are manufactured according to techniques of semi-conductors. Therefore, several thousand of these microtips can be produced in a pattern of 100×100 $\mu$m. These patterns can be drawn on surfaces that are as large as 500×500 mm. The medium 23 can be silica, a material that is transparent to UV radiation. The test device that combines according to one embodiment of the present invention the photoelectric effect and microtips is particularly suited to testing circuits bearing semi-conductor chips, commonly referred to as "chip carriers". In fact, it is a small printed circuit (typically 35 mm×35 mm) with a special geometry, very dense, produced with advanced technologies in the field of substrate manufacturing. In this circuit represented in FIG. 6, the equipotential lines have two test points 4, 4' interconnected by a conductor 29, one 4' formed on the bottom side with a very fine pitch, and the other 4 on the top side with a larger pitch, between 0.25 mm and more than 0.5 mm.

The chip carriers are in the form of bands typically f a length of 150 mm. The useful test surface is therefore 200×200 mm maximum.

In view of these remarks, it is possible to consider the description of a contactless test device with a simplified architecture to test "chip carriers".

Figure 6:
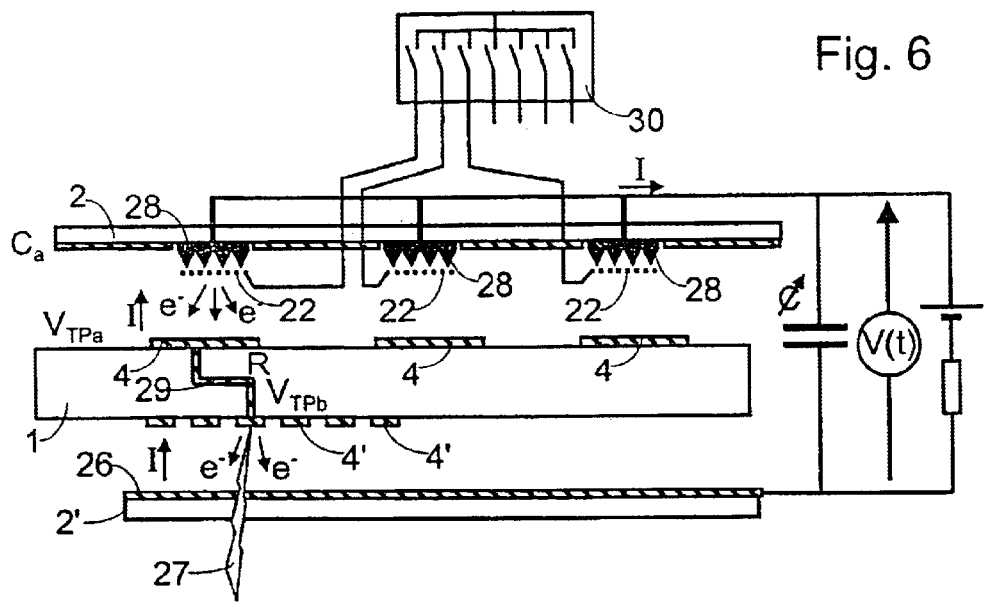
FIG. 6 shows a cross-section of a test device according to the fourth preferred embodiment of the present invention.

In FIG. 6, the test device comprises on a surface for example in the order of 200 mm×200 mm, a network of sets 28 of microtips, arranged on the plate 2 according to a matrix configuration, for example with a pitch of 100 $\mu$m, the test points being arranged with a pitch of 200 $\mu$m.

The sets of microtips can be arranged such that their feed current is common to them all, and that the control of grid 30 (multiplexed according to a line/column principle according to the standard technology used for microtips) is sufficient to make them active: it is therefore not necessary to multiplex either the collectors (one per side is sufficient), or the microtips: the measuring circuit is therefore basic and easy to implement.

The measurement of the continuity resistance is for example conducted by studying the transient of the charge of a large capacitance C: the slope of the charge gives the resistance sought.

The insulation test can be conducted according to the following method:

In a first step, all the equipotential lines of one side are bombarded (charged) by the microtips, that are all put to the same potential that can be measured on the other side, on the points 4' by photoelectric effect using an ultraviolet laser beam 27. For that purpose, a given voltage is applied to the collector 2', and, using short pulses of light, the electrode 26 is regularly checked to make sure it no longer collects electrons. At that time, the potential of the tested pad is the (known) potential of the collector 2'. It is then possible to quickly check that all the tracks are at this potential, by bombarding them in turn, until the plate 2 no longer collects electrons. Thus, a potential reference is established for all the pads.

It should be noted that this step can be conducted at the same time on a second circuit, after discharging its predecessor, while the first circuit is being tested.

Then, a pad 4' is locally discharged by photoelectric effect (the potential of the collector 2' is raised by 40 V for example). Once the pad is discharged, the evolution of its potential is observed for a few µs, then it is bombarded again to see if electrons are recovered. If its potential progresses without bombarding the pad, that reveals a leak of electrons, and therefore an insulation problem.

In a secondary step, the defective resistance can be measured, by sweeping all the pads, according to the real measuring method of resistance described above for the continuity.

Then the pad 4 is recharged by controlling the set of microtips located opposite the pad 4' to which it is linked and the operations described above are repeated for another conductor 29.

Figure 7:
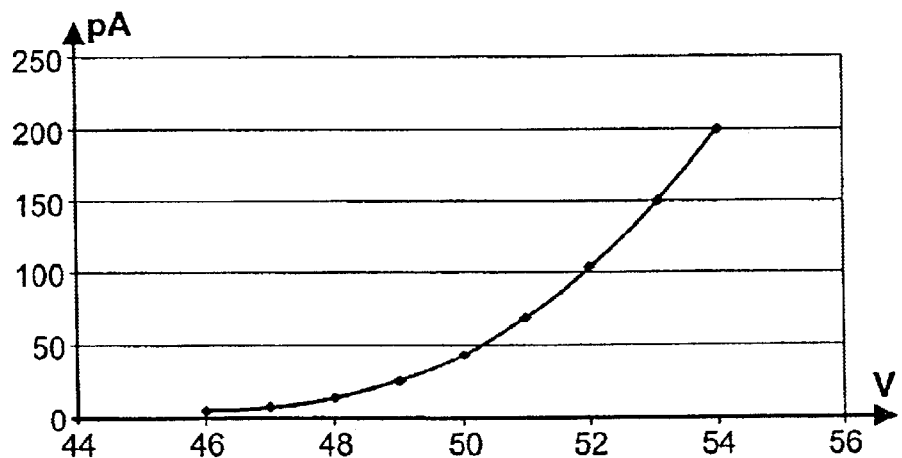
FIG. 7 shows a curve of a test current obtained in the device represented in FIG. 6.

FIG. 7 shows an example of a current curve giving the mean value of the current measured as a function of the acceleration voltage of electrons (grid voltage 22), when a circuit is established combining a link by photoelectric effect and a link by microtip effect, the voltage V of the microtips being kept constant at 48 V. This curve shows that there is an optimum voltage close to 54 Volts, for which the mean value of the current can reach 200 pico-amperes (pA), while the current in peak value can reach much higher values.

This curve proves that it is possible to cause a current to circulate in a conductor without contact therewith. It is also possible to consider amplifying the current by any appropriate means.

It will be understood that this test method can be applied to any circuits in which the equipotential lines can have terminations on any side of the circuit. For that purpose, one network of sets of microtips is sufficient and at least one ultraviolet laser source, opposite each side of the circuit, which is made possible by the fact that the matrices of microtips can be formed on a silica substrate that is transparent to ultraviolet radiation.

Figure 8:
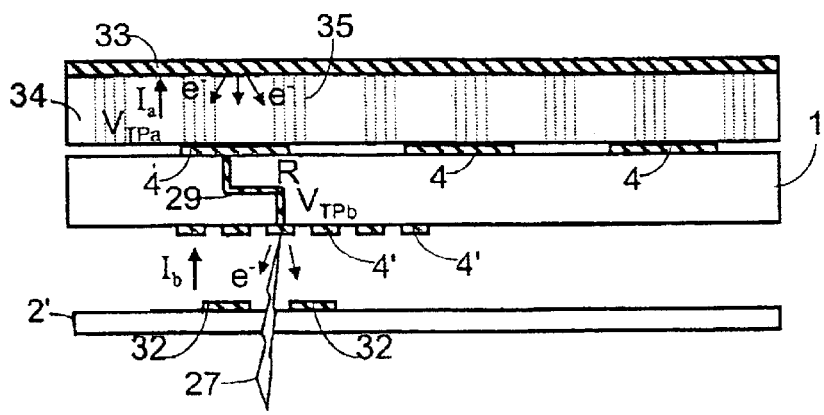
FIG. 8 shows a cross-section of a test device according to a fifth preferred embodiment of the present invention.

In one preferred variation of the present invention, represented in FIG. 8, the network of sets of microtips is replaced by a network of conductive pads 33 arranged in pixels with a pitch in the order of 100 µm. The connection of this network to the conductors 4, 4' of the substrate, is achieved by an anisotropic conduction elastomer sheet 34, like the one manufactured by the Japanese company Japan Synthetic Rubber. This sheet 34 comprises conductive particles 35 that are embedded in the elastomer, such that when it is compressed, the particles touch each other and conduct in a direction perpendicular to the plane of the network of conductors 33. The pixels of the network of conductive pads are individually programmable in voltage by line / column multiplexing.

This network of conductors is particularly suited to testing "chip carriers". In fact, the pitch of the pixels enables the test points that are arranged according to a pitch of 150 to 200 µm to be individually accessed. On the other side of the "chip carrier", the contact pads are discharged by photoelectric effect, by means of an ultraviolet laser source that emits a beam 27 onto a selected contact pad 4', the electrons thus extracted being gathered by a collection plate 2' provided with conductive pads 32 for that purpose.

To conduct a continuity test of the conductor 29 of the "chip carrier", the conductive sheet 33 of the network of conductors is taken to a negative potential that is transmitted to the conductors 4 of the "chip carrier" by the elastomer 34. Then, the contact pads 4' located on the other side of the "chip carrier" just need to be tested one after the other using the laser beam 27. If the contact pad 4' is linked by a conductor 29 to a conductor 4, a current $I_a$ is established between the conductor 4 and the conductive sheet 33, and $I_b$ between the pads 4' and 32. The measurement of this current enables the continuity resistance of the conductor 29 to be determined between the pads 4 and 4'.

To conduct an insulation test, all the pixels of the network of conductors 33 are taken to a negative potential except those near the pad 4 to be tested. Then the pad 4' opposite on the bottom side is charged with the laser beam 27, until its potential reaches a given positive value that is that of the collector 32. A few microseconds later, the laser beam is sent onto this pad 4' again. If electrons are gathered by the collector 32 (if a current passes between the network of conductors 33 and the collector 32), that means that a migration of electrons has occurred from other tracks towards the tested track, and that there is therefore an insulation defect. A global leak resistance can be determined from the charging time of the conductor and from the surface area thereof.

Similarly, a local leak resistance can be determined by measuring the resistance between the track tested and each of the other tracks of the substrate to be tested.

The possibility of controlling the charging and discharging of a given conductor that is among others on a substrate, such as a printed circuit, leads to the possibility of checking the quality of the interconnection, or in other terms testing it, even for the most complex substrates, without mechanical contact, without specific tools, at processing speeds that are compatible with production requirements, at much lower costs than those currently incurred, which makes this application very interesting from an industrial point of view, to test bare circuits, such as printed circuits for cellular telephones, circuits equipped with components, and certain applications in the field of the semi-conductor for which the possibility of measuring either the potential, or the frequency, or measuring or injecting electric currents is an advantage. Indeed, it is possible, with the method described as part of this invention, since it enables the evolution of the potential of a conductor to be accurately monitored, to determine the form of the corresponding signal, and therefore its frequency if it is an alternative signal. This property could therefore be used for the functional test of cards equipped with components, consisting, for example, in examining the response of certain signals in relation to a given stimulus.

What is claimed is:

1. A method for establishing an electric current in a conductor between a first point of the conductor and a second point of the conductor that is different from the first point, the method comprising:

providing, proximate to the conductor, a plate that has a plurality of conductive zones capable of being individually adjusted to any electric potential, and such the at least one conductive zone is located opposite to the conductor, applying a beam of particles to the first point of the conductor to extract electrons from it, without any physical contact with the conductor, the extracted electrons being received by said conductive zone located opposite to the conductor, and at the same time, injecting electrons at the second point of the conductor, producing a circulation of electric current in the conductor between the first point and the second point.

2. The method according to claim 1, wherein said beam of particles is a beam of light emitted by an ultraviolet light source, having sufficient energy to extract electrons from the conductor.

3. The method according to claim 1, further comprising the steps of:
- taking the conductor to a first potential,
- taking a first conductive zone of the plate, located near the first point of the conductor, to a second predefined potential that is higher than the first potential, and
- taking conductive zones that are near the first conductive zone to a third potential that is lower than the second potential, so that the electrons extracted from the conductor by the beam of particles are channeled towards the first conductive zone by these neighboring conductive zones.

4. The method according to claim 3, wherein the injection of electrons at the second point of the conductor includes taking a third conductive zone of the plate, located near said second point, and zones that are near the third conductive zone, to a potential that is close to the first potential, then applying a beam of particles to the third conductive zone.

5. The method according to claim 1, wherein the injection of electrons at the second point of the conductor is performed using the plate without any physical contact with the conductor, the method comprising the step of applying a beam of particles to one of said conductive zones including a metal layer having a thickness such that electrons are emitted when a beam of particles is received, the conductive zone being located opposite to the second point of the conductor such that the conductive zone emits electrons towards the second point of the conductor.

6. The method according to claim 3, wherein the injection of electrons at the second point of the conductor is performed using sets of microtips, arranged opposite said second point of the conductor, and using a conductive grid and applying a potential to the grid that is higher than a predetermined potential applied to the microtips.

7. The method according to claim 6, wherein the sets of microtips are arranged in a matrix network on the plate, each set being individually controllable to emit electrons towards one of a plurality of conductors on a substrate.

8. The method according to claim 3, wherein the injection of electrons at the second point of the conductor is performed using a network of conductive pads arranged in pixels, each conductive pad being capable of being individually adjusted to any potential, and an anisotropic conduction elastomer sheet comprising conductive particles that are embedded in the elastomer sheet, such that the conductive particles touch each other and conduct in a direction that is perpendicular to the plane of the conductor when the elastomer sheet is pressed against the network of conductive pads.

9. An electric test method of a plurality of conductors arranged on an insulating substrate, comprising an initial step of arranging, opposite at least one side of the substrate, a plate that has, near each conductor of the substrate, conductive zones capable of being individually adjusted to any electric potential, the method further comprising:
- a continuity test step of the conductors of the substrate including, for each conductor of the substrate, establishing a current in the conductor between a first point of the conductor and a second point of the conductor that is different from the first point by providing, proximate to the conductor, a plate that has a plurality of conductive zones capable of being individually adjusted to any electric potential, and such that at least one conductive zone is located opposite to the conductor, applying a beam of particles to the first point of the conductor to extract electrons from it without any physical contact with the conductor, the extracted electrons being received by said conductive zone located opposite to the conductor, and at the same time, injecting electrons at the second point of the conductor, producing a circulation of electric current in the conductor between the first point and the second point and measuring the cat thus established.

10. The test jest method according to claim 9, further including the step of determining the resistance of the conductor between the first and the second point of the conductor, and comparing the resistance thus determined with a predefined threshold, a defect being detected if the resistance is above said threshold.

11. The test method according to claim 9, further including an insulation test step of the conductors of the substrate, including:
- taking all the conductors of the substrate to a predefined potential, and
- for each conductor of the substrate, establishing a flow of electrons from the first point of the conductor towards a fist conductive zone of the plate, located near the point of the conductor, to take the conductor to a first predetermined potential, the flow being established by apply the first potential to the first conductive zone, and a second predefined potential lower than the fist potential to conductive zone, near the first zone, and by applying a beam of particles to the first point of the conductor, and measuring the charging current of the conductor that tends towards zero at the end of a predetermined time if the conductor is insulated.

12. The test method according to claim 11, wherein, if an insulation defect is detected on a conductor during the insulation test step, a secondary insulation test step of measuring the resistance between the defective conductor and all the other conductors of the substrate is performed.

13. An electric test device of conductors arranged on an insulating substrate, comprising:
- at least one source of particles, to emit a beam of particles towards a first point of a selected conductor, so as to t electrons from said selected conductor therefore increase the electric potential of said selected conductor,
- at least one plate, arranged opposite to one respective side of the insulating substrate, and comprising fit conductive zones, said first conductive zones being capable of being individually adjusted to any electric potential so that a selected one of the first conductive zones located opposite the first point of the selected conductor can receive the extracted electrons without any physical contact between the plate and the selected conductor,
- means for injecting electrons at any determined second point of the selected conductor on the insulating substrate simultaneous to the electron extraction from said selected conductor, the second point being different from the first point, and
- a control and measuring station to individually adjust the conductive zones to any electric potential and to measure currents and voltages between a selected two conductive zones.

14. The electric test device Wise according to claim 13, wherein the source of particles is a source of ultraviolet light.

15. The electric test device according to claim 13, wherein the plate further includes second conductive zones, and further including means for
- taking the selected conductor to a first potential,
- taking the selected one of the first conductive zones of the plate to a second predefined potential that is greater than the fist potential, and taking a selected plurality of the second conductive zones that are near to the selected one of the first conductive zones to a third potential lower than the second potential, so that the electrons from the conductor by the beam of particles are channeled towards the first conductive zone by the selected plurality of the second conductive zone.

16. The electric test device according to claim 13, wherein the means for injecting electrons comprise the conductive zones arranged on said plate and wherein the conductive zones comprise a thickness of metal such that electrons are emitted when a beam of particles is received.

17. The electric test device according to claim 13, wherein the source of particles comprises a plurality of laser micro-sources arranged over the surface of the plate.

18. The electric test device Bee according to claim 17, wherein each laser micro-source is arranged at a distance from the plate and emits a light beam, the angle of which is adjustable around a 90° angle in relation to the plane of the plate.

19. The electric test devices according to claim 13, wherein the means for injecting elects comprises a matrix network of sets of microtips individually controlled to emit electrons.

20. The electric test device according to claim 13, wherein the means for injecting electrons comprises a network of conductive pads arranged in pixels, and an anisotropic conduction elastomer sheet in a perpendicular direction to said surface, said elastomer sheet being applied against the conductor, each conductive pad being capable of being individually taken to any adjustable potential.

21. The electric test device according to claim 13, wherein the means for injecting electrons comprise a plurality of sources of electrons arranged to a matrix network and individually controllable by line/column addressing.

22. The electric test device according to claim 13, wherein the control and measuring station comprises addressing means to select the conductive zones of the plates, to take to a determined potential, and from which the current or the voltage is measured.

23. The electric test device according to claim 13, further comprising a partial vacuum chamber in which the insulating substrate and each plate are arranged.

* * * * *

UNITED STATES PATENT AND TRADEMARK OFFICE
CERTIFICATE OF CORRECTION

PATENT NO. : 6,859,052 B1
DATED : February 22, 2005
INVENTOR(S) : Vaucher

It is certified that error appears in the above-identified patent and that said Letters Patent is hereby corrected as shown below:

Column 2,
Line 14, delete "≈mW" and insert -- ≈1mW --.
Line 43, delete the second occurrence of "it" and insert -- if --.

Column 5,
Line 57, after "are" and insert -- arranged. --.

Column 6,
Line 21, after "holes" insert -- 3. --.

Column 8,
Line 18, delete "$V^+$" and insert -- $V^-$ --.
Line 52, delete "A" and insert -- $V^+$ --.
Line 58, delete "V+" and insert -- $V^+$ --.

Column 10,
Line 30, delete "f" and insert -- of --.

Column 12,
Line 52, delete "such the" and insert -- such that --.

Column 14,
Line 6, delete "cat" and insert -- current --.
Line 7, delete "jest".
Line 22, delete "apply" and insert -- applying --
Line 38, delete "to t" and insert -- to extract --
Line 39, after "conductor" insert -- and --.
Line 58, delete "Wise".
Line 67, delete "fist" and insert -- first --.

UNITED STATES PATENT AND TRADEMARK OFFICE
CERTIFICATE OF CORRECTION

PATENT NO. : 6,859,052 B1
DATED : February 22, 2005
INVENTOR(S) : Vaucher

It is certified that error appears in the above-identified patent and that said Letters Patent is hereby corrected as shown below:

<u>Column 15,</u>
Line 14, delete "Bee".
Line 19, delete "devices" and insert -- device --.
Line 20, delete "elects" and insert -- electrons --.

Signed and Sealed this

Twenty-sixth Day of July, 2005

JON W. DUDAS
*Director of the United States Patent and Trademark Office*